United States Patent
Beng et al.

(10) Patent No.: US 11,016,121 B2
(45) Date of Patent: May 25, 2021

(54) METHODS OF CONTROLLING THE OPERATION OF PROBE STATIONS AND PROBE STATIONS THAT PERFORM THE METHODS, THE METHODS INCLUDING GENERATING AND EXECUTING A TEST ROUTINE THAT DIRECTS THE PROBE STATION TO ELECTRICALLY TEST A TEST SUBSET OF A PLURALITY OF DUTS AND TO PRE-TEST A PRE-TEST SUBSET OF A PLURALITY OF DUTS, WHICH IS A SUBSET OF THE TEST SUBSET, WITH A PRE-TEST

(71) Applicant: FormFactor, Inc., Livermore, CA (US)

(72) Inventors: Sia Choon Beng, Singapore (SG); David Randle Hess, Beaverton, OR (US); Chunyi Yin Leong, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 133 days.

(21) Appl. No.: 16/421,173

(22) Filed: May 23, 2019

(65) Prior Publication Data

US 2019/0369141 A1 Dec. 5, 2019

Related U.S. Application Data

(60) Provisional application No. 62/680,929, filed on Jun. 5, 2018.

(51) Int. Cl.
*G01R 1/02* (2006.01)
*G01R 31/26* (2020.01)
(Continued)

(52) U.S. Cl.
CPC ........... *G01R 1/025* (2013.01); *G01R 1/0408* (2013.01); *G01R 1/06705* (2013.01); *G01R 31/2607* (2013.01)

(58) Field of Classification Search
CPC .. G01R 1/025; G01R 1/0408; G01R 1/06705; G01R 31/2607; G01R 31/287;
(Continued)

(56) References Cited

U.S. PATENT DOCUMENTS

2009/0096462 A1* 4/2009 Wang .................. H01L 22/24
324/501
2017/0269183 A1* 9/2017 Bock .................... G01R 35/007
(Continued)

*Primary Examiner* — Jay Patidar
(74) *Attorney, Agent, or Firm* — Dascenzo Gates Intellectual Property Law, P.C.

(57) ABSTRACT

Methods of controlling the operation of probe stations and probe stations that perform the methods. The methods including generating a test routine by constructing a substrate map, receiving a test subset input from a user, and updating the substrate map to incorporate information regarding which devices under test (DUTS) of a plurality of DUTs are in a test subset of a plurality of DUTs. The methods also include receiving a pre-test subset input from the user, wherein the pre-test subset is a subset of the test subset, and updating the substrate map to incorporate information which DUTs of the test subset are in the pre-test subset. The methods further include executing the test routine by moving a probe assembly to each DUT in the test subset, selectively performing a pre-test routine on each DUT that is in the pre-test subset, and electrically testing each DUT in the test subset.

20 Claims, 4 Drawing Sheets

(51) Int. Cl.
*G01R 1/067* (2006.01)
*G01R 1/04* (2006.01)

(58) Field of Classification Search
CPC ............ G01R 31/2874; G01R 31/2863; G01R 31/2887; G01R 31/26; G01R 31/2601; G01R 31/2603; G01R 31/2834; G01R 31/2851; G01R 31/2831; G01R 31/318511; H01L 21/67242; H01L 21/00; H01L 21/20; H01L 21/30
See application file for complete search history.

(56) References Cited

U.S. PATENT DOCUMENTS

2017/0285083 A1* 10/2017 McMullen ............ G01R 31/003
2018/0341399 A1* 11/2018 Fiedler ................. G06F 3/04845
2019/0227116 A1* 7/2019 Boduch .............. G01R 31/2886

* cited by examiner

METHODS OF CONTROLLING THE OPERATION OF PROBE STATIONS AND PROBE STATIONS THAT PERFORM THE METHODS, THE METHODS INCLUDING GENERATING AND EXECUTING A TEST ROUTINE THAT DIRECTS THE PROBE STATION TO ELECTRICALLY TEST A TEST SUBSET OF A PLURALITY OF DUTS AND TO PRE-TEST A PRE-TEST SUBSET OF A PLURALITY OF DUTS, WHICH IS A SUBSET OF THE TEST SUBSET, WITH A PRE-TEST

RELATED APPLICATION

This application claims priority to U.S. Provisional Patent Application No. 62/680,929, which was filed on Jun. 5, 2018, and the complete disclosure of which is hereby incorporated by reference.

FIELD OF THE DISCLOSURE

The present disclosure relates to probe stations for testing a device under test and to associated methods.

BACKGROUND OF THE DISCLOSURE

Probe stations may be utilized to test the operation, functionality, and/or performance of a plurality of devices under test (DUTs). Conventional probe stations include a chuck, which defines a support surface configured to support a substrate that includes the DUTs, and a probe assembly configured to communicate with the DUTs. Conventional probe stations also include a controller for controlling the operation of at least a portion of the probe station, as well as a user interface, which may include a keyboard, a mouse, and/or a display. A user interacts with the controller via the user interface to configure a test routine of the probe station to test the DUTs with the probe station. For example, the user may utilize the user interface to select which DUTs are to be subjected to a given electrical test. However, conventional probe stations may not provide a desired level of testing flexibility. Thus, there exists a need for improved methods for controlling the operation of probe stations.

SUMMARY OF THE DISCLOSURE

Probe stations for testing a plurality of devices under test and associated methods are disclosed herein. The methods include generating a test routine and executing the test routine. The probe stations include probe stations that perform the methods.

DETAILED DESCRIPTION AND BEST MODE OF THE DISCLOSURE

Figure 1:
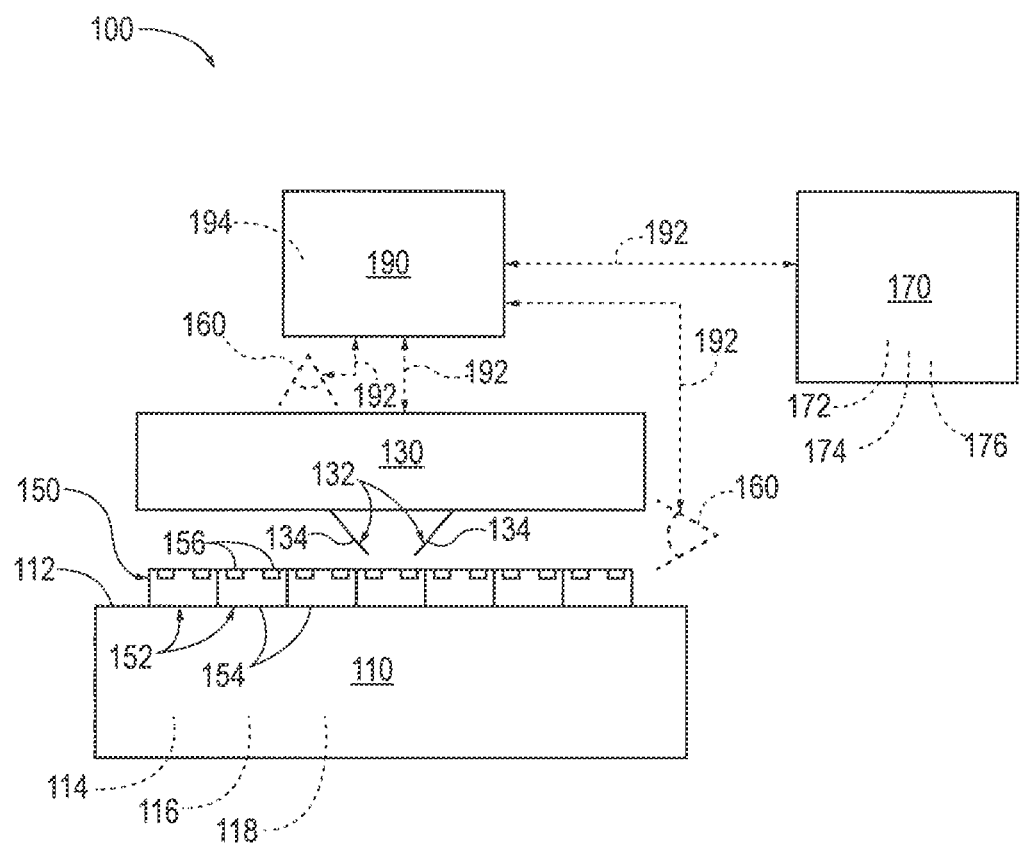
FIG. 1 is a schematic illustration of examples of a probe station for testing a plurality of devices under test (DUTs) that may be utilized with methods according to the present disclosure.

FIGS. 1-5 provide examples of probe stations 100 and/or of methods 200 according to the present disclosure. Elements that serve a similar, or at least substantially similar, purpose are labeled with like numbers in each of FIGS. 1-5, and these elements may not be discussed in detail herein with reference to each of FIGS. 1-5. Similarly, not all elements may be labeled in each of FIGS. 1-5, but reference numerals associated therewith may be utilized herein for consistency. Elements, components, and/or features that are discussed herein with reference to one or more of FIGS. 1-5 may be included in and/or utilized with any of FIGS. 1-5 without departing from the scope of the present disclosure.

In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic representation of examples of probe stations 100 that may be utilized with methods 200, according to the present disclosure. Probe stations 100 may be configured to test, or electrically test, the operation of each of a plurality of devices under test (DUTs) 154 that are formed on a substrate 150. As used herein, substrate 150 also may be referred to as a wafer 150. As schematically illustrated in FIG. 1, substrate 150 includes a plurality of DUTs 154, each of which includes one or more contact pads 156. In some embodiments, such as when substrate 150 is a wafer 150, wafer 150 may include and/or define a plurality of dies 152, such that each die 152 may include and/or be a corresponding DUT 154.

Probe stations 100 include a chuck 110 that defines a support surface 112, which is configured to support substrate 150. Probe stations 100 also include a probe assembly 130 including a plurality of probes 132 with a plurality of corresponding probe tips 134. Probe tips 134 are adapted, configured, and/or oriented to contact a plurality of corresponding contact pads 156 on or otherwise associated with DUT 154.

Probe station 100 also includes a controller 190, which is programmed to control the operation of at least a portion of the probe station. This control may be performed via and/or may utilize any suitable communication linkage 192, which may permit controller 190 to communicate with at least one other component of probe station 100 in a wired and/or wireless manner.

Controller 190 may include and/or be any suitable structure, device, and/or devices that may be adapted, configured, designed, constructed, and/or programmed to perform the functions discussed herein. This may include controlling the operation of the at least one other component of probe station 100, such as via and/or utilizing methods 200, which are discussed in more detail herein. As examples, controller 190 may include one or more of an electronic controller, a dedicated controller, a special-purpose controller, a personal computer, a special-purpose computer, a display device, a touch screen display, a logic device, a memory device, and/or a memory device having computer-readable storage media 194.

The computer-readable storage media 194, when present, also may be referred to herein as non-transitory computer-readable storage media. This non-transitory computer-readable storage media may include, define, house, and/or store computer-executable instructions, programs, and/or code; and these computer-executable instructions may direct probe station 100 and/or controller 190 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

As illustrated in dashed lines in FIG. 1, probe station 100 may include an imaging device 160, or a plurality of spaced-apart imaging devices 160, which may be configured to view and/or image one or more portions, or regions, of probe station 100. Stated another way, each imaging device 160 may be configured to collect a distinct image of probe station 100. As such, and when probe station 100 includes the plurality of imaging devices 160, the plurality of imaging devices may collect a plurality of distinct, or different, images of the probe station. As schematically illustrated in FIG. 1, each imaging device 160 may be electrically connected to controller 190 via communication linkage 192.

As further illustrated in dashed lines in FIG. 1, probe station 100 may include a user interface 170 configured to receive inputs from a user, to provide the user with a graphical representation and/or image, and/or to otherwise permit the user to interact with controller 190. As examples, user interface 170 may include a keyboard 174 and/or a mouse 176 configured to receive an input from the user, and/or may include a display 172 configured to provide the user with a graphical representation and/or image. In some embodiments of probe stations 100, display 172 may include and/or be a touch screen, or a touch screen display, which may be configured to permit interaction between a user and controller 190 via tactile interaction between the user and the touch screen display. As schematically illustrated in FIG. 1, user interface 170 may be electrically connected to controller 190 via communication linkage 192.

As discussed, support surface 112 of chuck 110 may be configured to support substrate 150. Chuck 110 further may be configured to control a temperature of substrate 150. As an example, chuck 110 may include and/or be a thermal chuck, which includes a chuck thermal module 118 that is configured to control and/or regulate a temperature of the chuck.

Chuck 110 also may be configured to control and/or regulate a relative orientation between substrate 150 and probe assembly 130 and/or between substrate 150 and one or more imaging devices 160. As an example, chuck 110 may include and/or may be associated with a chuck translation structure 114, which may be in communication with controller 190 and/or which may be configured to operatively translate support surface 112 relative to probe assembly 130. As another example, chuck 110 may include and/or be associated with a chuck rotation structure 116, which may be in communication with controller 190 and/or which may be configured to operatively rotate support surface 112 relative to probe assembly 130.

Figure 2:
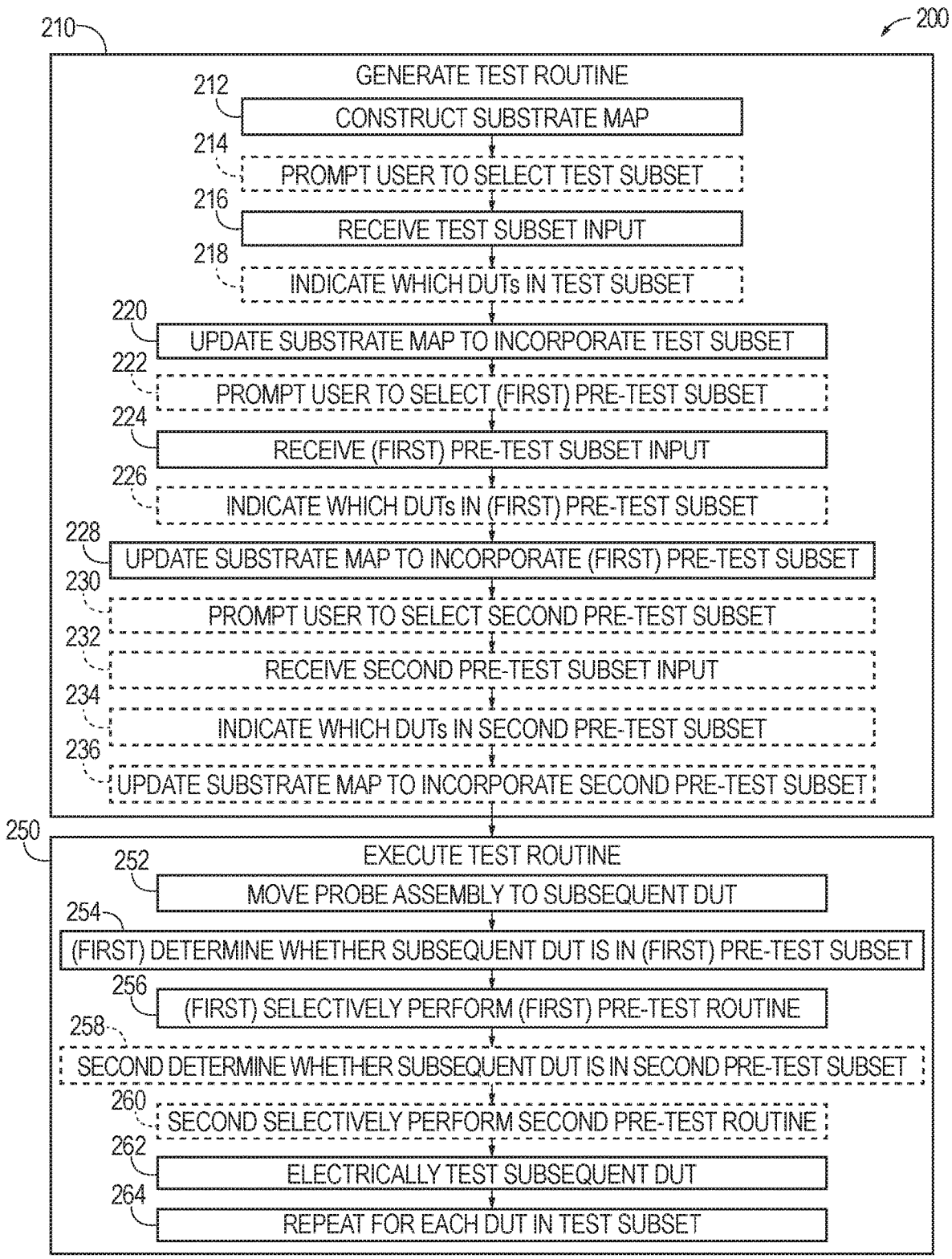
FIG. 2 is a flowchart depicting examples and methods, according to the present disclosure, for controlling the operation of probe stations according to the present disclosure.
Figure 4:
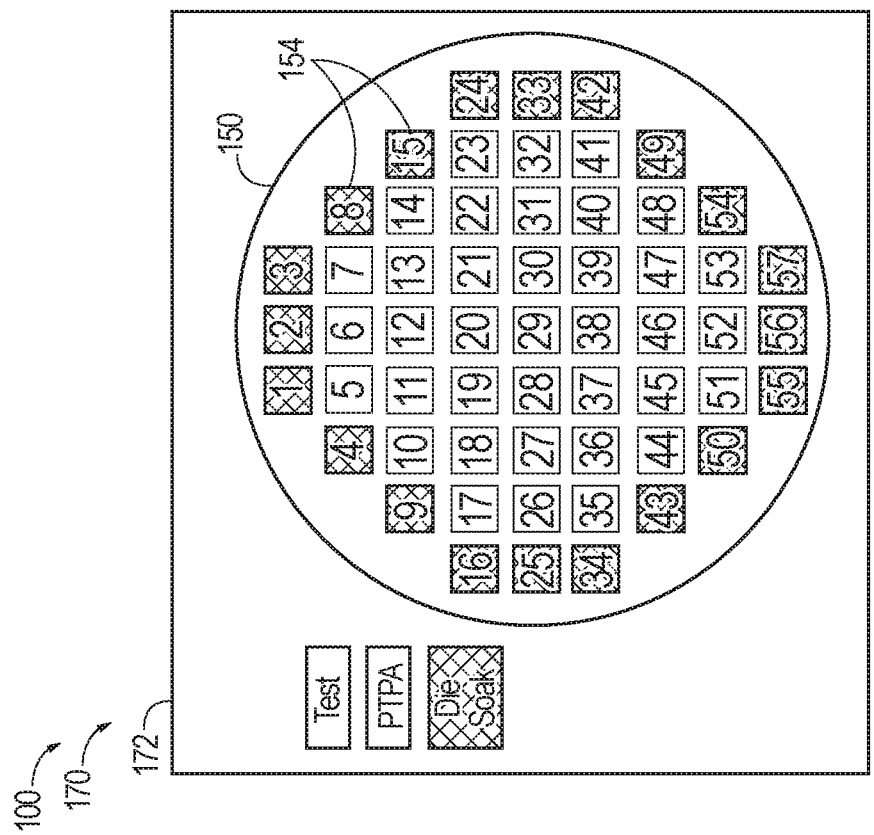
FIG. 4 is a schematic illustration of an example of a display displaying a graphical representation of a substrate map and of a first pre-test subset according to the present disclosure.
Figure 3:
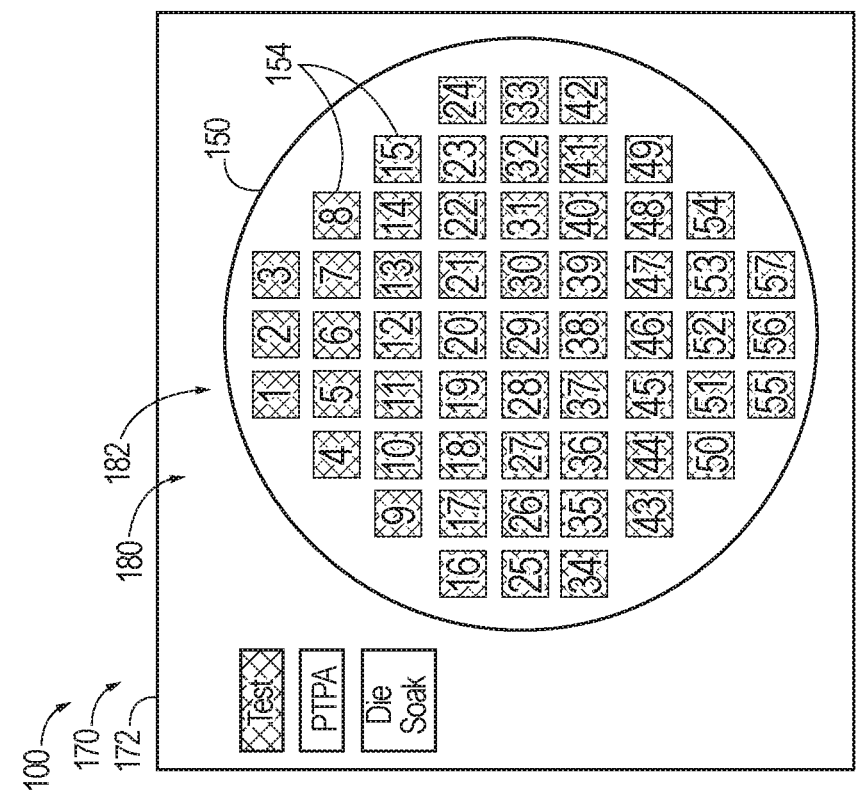
FIG. 3 is a schematic illustration of an example of a display displaying a graphical representation of a substrate map and of a test subset according to the present disclosure.
Figure 5:
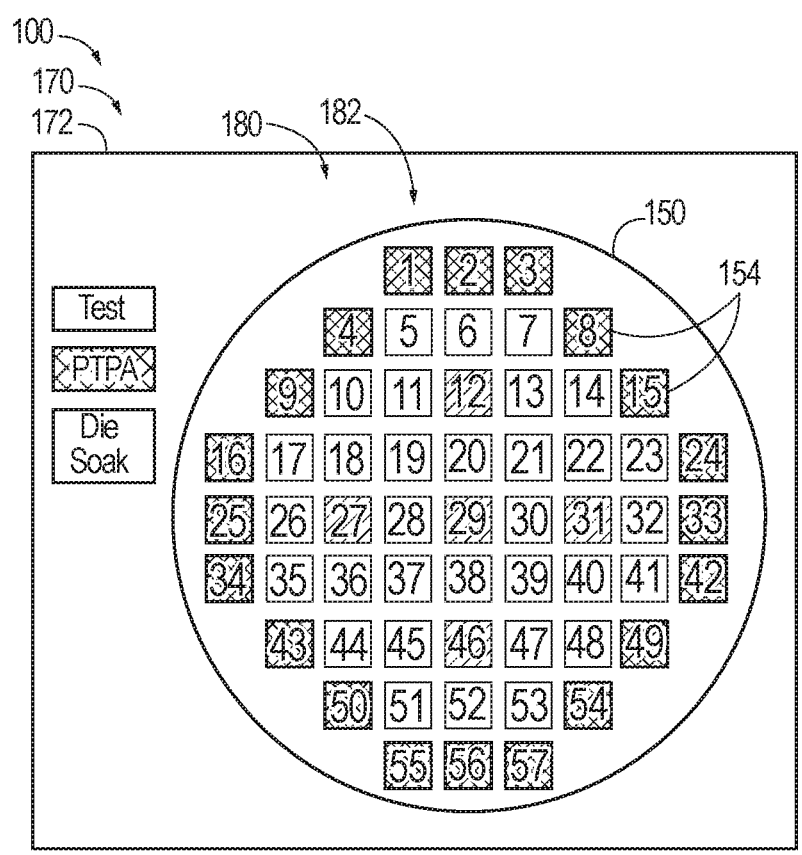
FIG. 5 is a schematic illustration of an example of a display displaying a graphical representation of a substrate map and of a second pre-test subset according to the present disclosure.

FIG. 2 is a flowchart depicting methods 200, according to the present disclosure, of controlling the operation of a probe station, such as probe station 100 of FIG. 1, while FIGS. 3-5 are illustrations of graphical representations that may be provided to a user during execution of methods 200. The probe station may be configured to test the operation of a plurality of devices under test (DUTs), such as DUTs 154 of FIG. 1, that are formed on a substrate, such as substrate 150 of FIG. 1. The substrate may be supported by a chuck, such as chuck 110 of FIG. 1. As illustrated in FIG. 2, methods 200 include generating, at 210, a test routine, and executing, at 250, the test routine. Methods 200 may be configured such that executing the test routine at 250 may be performed at least substantially autonomously and/or without human supervision.

Generating the test routine at 210 includes constructing, at 212, a substrate map that includes information regarding a position of each DUT of the plurality of DUTs on the substrate. As used herein, the substrate map may refer to any appropriate data structure that contains the information regarding the position of each DUT on the substrate, and/or may refer to a graphical representation of the data structure. As examples, the substrate map may include a unique identifier for each DUT (such as a series of integers serially assigned to each DUT of the plurality of DUTs), information regarding the position of each DUT relative to the substrate, information regarding the position of each DUT relative to at least one other DUT, and/or a visual and/or graphical representation, image, map, and/or wafer map that visually illustrates each DUT on the substrate.

Generating the test routine at 210 further includes receiving, at 216, a test subset input from a user. The test subset input is representative of a test subset of the plurality of DUTs, defined such that each DUT in the test subset is selected to be subjected to an electrical test. Stated differently, the test subset input identifies which DUTs of the plurality of DUTs will be subjected to an electrical test during the executing the test routine at 250. Accordingly, each DUT of the plurality of DUTs that is not in the test subset is not subjected to the electrical test during the executing the test routine at 250. As used herein, the term "subset," as used to refer to a collection of members of a group, may refer to a collection of zero members of the group; may refer to a collection of all the members of the group; or may refer to a collection of some, but not all, of the members of the group.

The receiving the test subset input at 216 may be performed in any appropriate manner. For example, and as illustrated in FIG. 2, generating the test routine at 210 may include, prior to receiving the test subset input at 216, prompting, at 214, the user to select the test subset. As a more specific example, prompting the user to select the test subset at 214 may include producing a graphical representation of the substrate map on a display, such as display 172 of FIG. 1, and prompting the user to select the DUTs that are to be subjected to the electrical test. The user may perform this selection in any appropriate manner, such as via a keyboard (such as keyboard 174 of FIG. 1), via a mouse (such as mouse 176 of FIG. 1), and/or by manipulating a touch screen display.

As another example, and as also illustrated in FIG. 2, generating the test routine at 210 may include, subsequent to receiving the test subset input at 216, indicating, at 218, to the user, which DUTs of the plurality of DUTs are in the test subset. The indicating at 218 may be performed in any appropriate manner. For example, the indicating at 218 may include producing a graphical representation of the substrate map on a display, such as display 172 of FIG. 1 and/or the same display as is utilized in the prompting at 214. FIG. 3 illustrates an example of a graphical representation 180 of a substrate map, such as may be presented to the user during the indicating at 218. As illustrated in FIG. 3, the graphical representation may represent the substrate and/or each DUT on the substrate, such as with a unique identifier (such as a numeral) to distinguish each DUT from each other DUT. The graphical representation may indicate which DUTs are in a test subset 182 in any appropriate manner, such as by representing each DUT in the test subset with a color and/or a shading. In the example of FIG. 3, each of the 57 DUTs on the substrate is selected to be in the test subset.

Returning to FIG. 2, generating the test routine at 210 further includes updating, at 220, the substrate map to incorporate information regarding which DUTs of the plurality of DUTs are in the test subset. The updating the substrate map at 220 may include updating in any appropriate manner, such as by manipulating the data structure corresponding to the substrate map to incorporate the information that was received during the receiving at 216. While FIG. 2 illustrates the updating at 220 as occurring subsequent to the indicating at 218, this is not required to all methods 200 according to the present disclosure, and it is additionally within the scope of the present disclosure that the updating at 220 may be performed prior to the indicating at 218 and/or at least partially concurrently with the indicating at 218, such as when the updating at 220 is performed in real-time as individual DUTs are selected for test by the user.

As further illustrated in FIG. 2, generating the test routine at 210 additionally includes receiving, at 224, a pre-test subset input from the user. The pre-test subset input is representative of a pre-test subset of the test subset of DUTs, defined such that each DUT in the pre-test subset is selected to be subjected to a pre-test routine that may be performed prior to electrically testing that DUT. Accordingly, each DUT of the plurality of DUTs that is not in the pre-test subset is not subjected to the pre-test routine. Stated differently, the pre-test subset of DUTs is a subset of the test subset of DUTs, which in turn is a subset of the plurality of DUTs defined on the substrate.

The pre-test routine may be and/or include any appropriate routine and/or process, such as may be desirable to prepare a given DUT for the electrical test. As an example, the electrical test may be performed at an elevated temperature, and the pre-test routine may include and/or be a thermal soak that includes heating a DUT (such as with chuck thermal module 118 of FIG. 1) for a predetermined period of time to limit a thermal drift of a probe tip (such as probe tip 134 of FIG. 1) with respect to a contact pad (such as contact pad 156 of FIG. 1) of the DUT during the electrical test.

As another example, the pre-test routine may include adjusting an alignment of a probe assembly (such as probe assembly 130 of FIG. 1) and the substrate, such as via a probe-to-pad alignment. More specifically, even when the dimensions and/or spacing of the DUTs of the plurality of DUTs is known, contacting small test pads may require periodic adjustment of an alignment between the probe assembly and the substrate such that the probe tips of the probe assembly are accurately positioned with respect to the corresponding contact pads while performing the electrical test. Such adjustment may be performed in any appropriate manner. As an example, an alignment between the probe assembly and the substrate may be measured via at least one imaging device (such as imaging devices 160 of FIG. 1), and an alignment of the substrate with respect to the probe assembly may be adjusted by moving the chuck (such as by utilizing chuck translation structure 114 of FIG. 1 and/or chuck rotation structure 116 of FIG. 1).

The receiving the pre-test subset input at 224 may be performed in any appropriate manner. For example, and as illustrated in FIG. 2, generating the test routine at 210 may include, prior to receiving the pre-test subset input at 224, prompting, at 222, the user to select the pre-test subset. As a more specific example, prompting the user to select the pre-test subset at 222 may include producing a graphical representation of the substrate map on the display, such as display 172 of FIG. 1, and prompting the user to select the DUTs that are to be subjected to the pre-test routine. The user may perform this selection in any appropriate manner, such as via a keyboard (such as keyboard 174 of FIG. 1), via a mouse (such as mouse 176 of FIG. 1), and/or by manipulating a touch screen display. The prompting at 222 may be configured such that the DUTs chosen to be in the pre-test subset must be selected from the DUTs previously selected to be in the test subset; however, this is not required of all embodiments.

As another example, and as also illustrated in FIG. 2, generating the test routine at 210 may include, subsequent to receiving the pre-test subset input at 224, indicating, at 226, to the user which DUTs of the test subset are in the pre-test subset. The indicating at 226 may be performed in any appropriate manner. For example, the indicating at 226 may include producing a graphical representation of the substrate map on a display, such as display 172 of FIG. 1 and/or the same display as is utilized in the prompting at 222. FIG. 4 illustrates an example of a graphical representation 180 of a substrate map, such as may be presented to the user during the indicating at 226. As illustrated in FIG. 4, the graphical representation may indicate which DUTs are in a pre-test subset 184 in any appropriate manner, such as by representing each DUT in the pre-test subset with a color and/or a shading. In the example of FIG. 4, 20 of the 57 DUTs on the substrate are selected to be in the pre-test subset.

Returning to FIG. 2, generating the test routine at 210 further includes updating, at 228, the substrate map to incorporate information regarding which DUTs of the test subset are in the pre-test subset. The updating the substrate map at 228 may include updating in any appropriate manner, such as by manipulating the data structure corresponding to the substrate map to incorporate the information that was received during the receiving at 224. While FIG. 2 illustrates the updating at 228 as occurring subsequent to the indicating at 226, this is not required to all methods 200 according to the present disclosure, and it is additionally within the scope of the present disclosure that the updating at 228 may be performed prior to the indicating at 226 and/or at least partially concurrently with the indicating at 226, such as when the updating at 228 is performed in real-time as individual DUTs are selected for the pre-test routine by the user.

In some examples of methods 200, it may be desirable to perform multiple distinct pre-test routines prior to electrically testing each DUT in the test subset. For example, the aforementioned pre-test routine may be a first pre-test routine, and methods 200 additionally may include generating and executing a test routine that incorporates a second pre-test routine. In such an example, the aforementioned pre-test subset may be referred to as a first pre-test subset. In such an example, and as illustrated in FIG. 2, generating the test routine at 210 additionally may include receiving, at 232, a second pre-test subset input from the user. The second pre-test subset input is representative of the second pre-test subset of the test subset of DUTs, defined such that each DUT in the second pre-test subset is selected to be subjected to the second pre-test routine. Accordingly, each DUT of the plurality of DUTs that is not in the second pre-test subset is not subjected to the second pre-test routine. Stated differently, the second pre-test subset of DUTs is a subset of the test subset of DUTs. The second pre-test subset additionally may be a subset of the first pre-test subset.

The receiving the second pre-test subset input at 232 may be performed in any appropriate manner. For example, and as illustrated in FIG. 2, generating the test routine at 210 may include, prior to receiving the second pre-test subset input at 232, prompting, at 230, the user to select the second pre-test subset. As a more specific example, prompting the user to select the second pre-test subset at 230 may include producing a graphical representation of the substrate map on the display, such as display 172 of FIG. 1, and prompting the user to select the DUTs that are to be subjected to the second pre-test routine. The user may perform this selection in any appropriate manner, such as via a keyboard (such as keyboard 174 of FIG. 1), via a mouse (such as mouse 176 of FIG. 1), and/or by manipulating a touch screen display. The prompting at 230 may be configured such that the DUTs chosen to be in the second pre-test subset must be selected from the DUTs previously selected to be in the test subset. Additionally or alternatively, in an example in which the second pre-test subset is a subset of the first pre-test subset, the prompting at 230 may be configured such that the DUTs chosen to be in the second pre-test subset must be selected from the DUTs previously selected to be in the first pre-test subset; however, this is not required of all embodiments.

As another example, and as also illustrated in FIG. 2, generating the test routine at 210 may include, subsequent to receiving the second pre-test subset input at 232, indicating, at 234, to the user which DUTs of the test subset are in the second pre-test subset. The indicating at 234 may be performed in any appropriate manner. For example, the indicating at 234 may include producing a graphical representation of the substrate map on a display, such as display 172 of FIG. 1 and/or the same display as is utilized in the prompting at 230. FIG. 5 illustrates an example of a graphical representation of a substrate map 180, such as may be presented to the user during the indicating at 234. As illustrated in FIG. 5, the graphical representation may indicate which DUTs are in a second pre-test subset 186 in any appropriate manner, such as by representing each DUT in the second pre-test subset with a color and/or a shading. In the example of FIG. 5, 25 of the 57 DUTs on the substrate are selected to be in the second pre-test subset.

Returning to FIG. 2, generating the test routine at 210 further may include updating, at 236, the substrate map to incorporate information regarding which DUTs of the test subset are in the second pre-test subset. The updating the substrate map at 236 may include updating in any appropriate manner, such as by manipulating the data structure corresponding to the substrate map to incorporate the information that was received during the receiving at 232. While FIG. 2 illustrates the updating at 236 as occurring subsequent to the indicating at 234, this is not required to all methods 200 according to the present disclosure, and it is additionally within the scope of the present disclosure that the updating at 236 may be performed prior to the indicating at 234 and/or at least partially concurrently with the indicating at 234, such as when the updating at 236 is performed in real-time as individual DUTs are selected for the second pre-test routine by the user.

With continued reference to FIG. 2, executing the test routine at 250 includes moving, at 252, the probe assembly from a given DUT in the test subset to a subsequent DUT in the test subset. As used herein, the probe assembly may be described as being positioned at, and/or as having been moved to, a given DUT when at least one probe tip of the probe assembly is generally aligned with a corresponding at least one contact pad of the given DUT. Stated differently, moving the probe assembly to the subsequent DUT does not require precisely aligning a probe tip with a contact pad of the subsequent DUT and does not require contacting a contact pad of the subsequent DUT with a probe tip.

Executing the test routine at 250 additionally includes determining, at 254, whether the subsequent DUT is in the pre-test subset (or the first pre-test subset). As an example, the determining at 254 may include inspecting and/or evaluating the substrate map to determine if the subsequent DUT is in the pre-test subset (or the first pre-test subset).

Subsequent to the determining at 254, executing the test routine at 250 includes selectively performing, at 256, the pre-test routine (or the first pre-test routine) responsive to the result of the determining at 254. More specifically, if the determining at 254 determined that the subsequent DUT is included in the pre-test subset (or the first pre-test subset), then selectively performing the pre-test routine at 256 includes performing the pre-test routine (or the first pre-test routine) on the subsequent DUT. Alternatively, if the determining at 254 determined that the subsequent DUT is not included in the pre-test subset (or the first pre-test subset), then selectively performing the pre-test routine at 256 includes skipping the pre-test routine (or the first pre-test routine) with respect to the subsequent DUT.

In examples of methods 200 in which generating the test routine at 210 includes receiving the second pre-test subset input at 232, executing the test routine at 250 further may include executing the second pre-test routine. In such examples, the determining at 254 may be referred to as first determining, at 254, whether the subsequent DUT is in the first pre-test subset, and the selectively performing at 256 may be referred to as first selectively performing, at 256, the first pre-test routine. In such examples, executing the test routine at 250 additionally may include, subsequent to moving the probe assembly to the subsequent DUT at 252, a second determining, at 258, whether the subsequent DUT is in the second pre-test subset. As an example, the second determining at 258 may include inspecting and/or evaluating the substrate map to determine if the subsequent DUT is in the second pre-test subset.

Subsequent to the second determining at 258, executing the test routine at 250 includes a second selectively performing, at 260, the second pre-test routine responsive to the result of the second determining at 258. More specifically, if the second determining at 258 determined that the subsequent DUT is included in the second pre-test subset, then the second selectively performing the second pre-test routine at 260 includes performing the second pre-test routine on the subsequent DUT. Alternatively, if the second determining at 258 determined that the subsequent DUT is not included in the second pre-test subset, then second selectively performing the second pre-test routine at 260 includes skipping the second pre-test routine with respect to the subsequent DUT.

While FIG. 2 illustrates the second determining at 258 and the second selectively performing at 260 as occurring subsequent to the first determining at 254 and the first selectively performing at 256, this is not required to all examples of methods 200 according to the present disclosure, and it is additionally within the scope of the present disclosure that the second determining at 258 and/or the second selectively performing at 260 may be performed prior to, and/or at least partially concurrently with, the first determining at 254 and/or the first selectively performing at 256.

As further illustrated in FIG. 2, executing the test routine at 250 includes, subsequent to selectively performing the pre-test routine (or the first pre-test routine) at 256, electrically testing, at 262, the subsequent DUT with the probe assembly. Electrically testing the subsequent DUT at 262 may include bringing at least one probe tip into electrical contact with a corresponding at least one contact pad of the subsequent DUT, performing an electrical test on the subsequent DUT via the probe tip, and/or removing the at least one probe tip from electrical contact with the corresponding at least one contact pad.

Executing the test routine at 250 further includes, subsequent to the electrically testing at 262, repeating, at 264, the moving at 252, the determining at 254, the selectively performing the pre-test routine (or the first pre-test routine) at 256, and the electrically testing at 262 for each remaining DUT in the test subset. In examples of methods 200 that include executing a first pre-test routine and a second pre-test routine, the repeating at 264 additionally may include repeating the second determining at 258 and the second selectively performing the second pre-test routine at 260 for each remaining DUT in the test subset. Stated differently, the repeating at 264 generally includes repeating each applicable step of the executing at 250 such that the electrical test is performed on each DUT in the test subset, the first pre-test routine is performed on each DUT in the first pre-test subset, and the second pre-test routine is performed on each DUT in the second pre-test subset.

In the present disclosure, several of the illustrative, non-exclusive examples have been discussed and/or presented in the context of flow diagrams, or flowcharts, in which the methods are sown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of probe stations and of methods of controlling the operation of a probe station according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of controlling the operation of a probe station, wherein the probe station includes a probe assembly that is configured to electrically test the operation of a plurality of devices under test (DUTs) formed on a substrate, the method comprising:

generating a test routine by:
(i) constructing a substrate map that includes information regarding a position of each DUT of the plurality of DUTs on the substrate;
(ii) receiving a test subset input from a user, wherein the test subset input is representative of a test subset of the plurality of DUTs, wherein each DUT in the test subset is selected to be subjected to an electrical test;
(iii) updating the substrate map to incorporate information regarding which DUTs of the plurality of DUTs are in the test subset;
(iv) receiving a pre-test subset input from the user, wherein the pre-test subset input is representative of a pre-test subset of the test subset, wherein each DUT in the pre-test subset is selected to be subjected to a pre-test routine; and
(v) updating the substrate map to incorporate information regarding which DUTs of the test subset are in the pre-test subset; and executing the test routine by:
(i) moving the probe assembly from a given DUT in the test subset of the plurality of DUTs to a subsequent DUT in the test subset of the plurality of DUTs;
(ii) determining whether the subsequent DUT is in the pre-test subset;
(iii) subsequent to the determining, selectively performing the pre-test routine on the subsequent DUT, wherein the selectively performing includes performing the pre-test routine responsive to the determining indicating that the subsequent DUT is included in the pre-test subset and skipping the pre-test routine responsive to the determining indicating that the subsequent DUT is not included in the pre-test subset;
(iv) subsequent to the selectively performing, electrically testing the subsequent DUT; and
(v) subsequent to the electrically testing, repeating the moving, the determining, the selectively performing, and the electrically testing to perform the pre-test routine on each remaining DUT in the pre-test subset and also to electrically test each remaining DUT in the test subset.

A2. The method of paragraph A1, wherein the pre-test routine includes a thermal soaking.

A3. The method of any of paragraphs A1-A2, wherein the pre-test routine includes a probe-to-pad alignment.

A4. The method of any of paragraphs A1-A3, wherein the generating the test routine further includes, prior to the receiving the test subset input, prompting the user to select the test subset.

A5. The method of paragraph A4, wherein the prompting the user to select the test subset includes producing a graphical representation of the substrate map on a display.

A6. The method of any of paragraphs A1-A5, wherein the method further includes, subsequent to the receiving the test subset input, indicating, to the user, which DUTs of the plurality of DUTs are in the test subset.

A7. The method of paragraph A6, wherein the indicating includes producing a graphical representation of the substrate map on a/the display.

A8. The method of any of paragraphs A1-A7, wherein the generating the test routine further includes, prior to the receiving the pre-test subset, prompting the user to select the pre-test subset.

A9. The method of paragraph A8, wherein the prompting the user to select the pre-test subset includes producing a graphical representation of the substrate map and of the test subset on a/the display.

A10. The method of any of paragraphs A1-A9, wherein the method further includes, subsequent to the receiving the pre-test subset input, indicating, to the user, which DUTs of the plurality of DUTs are in the pre-test subset.

A11. The method of paragraph A10, wherein the indicating includes producing a graphical representation of the substrate map and of the pre-test subset on a/the display.

A12. The method of any of paragraphs A1-A11, wherein the pre-test subset is a first pre-test subset; wherein the pre-test routine is a first pre-test routine; wherein the determining is a first determining whether the subsequent DUT is in the first pre-test subset; wherein the selectively performing the pre-test routine is a first selectively performing the first pre-test routine; wherein the generating the test routine further includes:

(i) receiving a second pre-test subset input from the user, wherein the second pre-test subset input is representative of a second pre-test subset of the test subset, wherein each DUT in the second pre-test subset is selected to be subjected to a second pre-test routine; and
(ii) updating the substrate map to incorporate information regarding which DUTs of the test subset are in the second pre-test subset;

wherein the executing the test routine further includes, prior to the electrically testing the subsequent DUT:
(i) second determining whether the subsequent DUT is in the second pre-test subset;
(ii) subsequent to the second determining, second selectively performing the second pre-test routine on the subsequent DUT, wherein the second selectively performing includes performing the second pre-test routine responsive to the second determining indicating that the subsequent DUT is included in the second pre-test subset and skipping the second pre-test routine responsive to the second determining indicating that the subsequent DUT is not included in the second pre-test subset;

and wherein the executing the test routine further includes, subsequent to the electrically testing, repeating the second determining and the second selectively performing to perform the second pre-test routine on each DUT in the second pre-test subset.

A13. The method of paragraph A12, wherein the generating the test routine further includes, prior to the receiving the second pre-test subset, prompting the user to select the second pre-test subset.

A14. The method of paragraph A13, wherein the prompting the user to select the second pre-test subset includes producing a graphical representation of the substrate map and of the test subset on a/the display.

A15. The method of any of paragraphs A12-A14, wherein the method further includes, subsequent to the receiving the second pre-test subset input, indicating, to the user, which DUTs of the plurality of DUTs are in the second pre-test subset.

A16. The method of paragraph A15, wherein the indicting includes producing a graphical representation of the substrate map and of the second pre-test subset on a/the display.

A17. The method of any of paragraphs A12-A16, wherein the second pre-test subset is a subset of the first pre-test subset.

A18. The method of any of paragraphs A12-A17, wherein the performing the first pre-test routine and the performing the second pre-test routine are performed sequentially.

A19. The method of any of paragraphs A12-A18, wherein the performing the first pre-test routine and the performing the second pre-test routine are performed at least partially concurrently.

A20. The method of any of paragraph A1-A19, wherein the executing the test routine is configured to be performed without human supervision.

B1. A probe station configured to test the operation of each of a plurality of devices under test (DUTs) formed on a substrate, the probe station comprising:

a chuck that defines a support surface that is configured to support the substrate;

a probe assembly that includes a plurality of probes with a plurality of corresponding probe tips configured to contact a plurality of corresponding contact pads of the plurality of DUTs; and a controller configured to execute the method of any of paragraphs A1-A20.

B2. The probe station of paragraph B1, wherein the controller includes a memory device having computer-readable storage media for storing computer-executable instructions corresponding to the method of any of paragraphs A1-A20.

B3. The probe station of any of paragraphs B1-B2, wherein the probe station further includes at least one imaging device configured to image at least a portion of the probe station.

B4. The probe station of any of paragraphs B1-B3, wherein the probe station further includes a user interface configured to permit a user to interact with the controller.

B5. The probe station of paragraph B4, wherein the user interface includes at least one of:

(i) a keyboard configured to receive an input from the user;

(ii) a mouse configured to receive an input from the user; and (iii) a display configured to provide the user with a graphical representation.

B6. The probe station of paragraph B5, wherein the display is a touch screen display configured to permit interaction between the user and the controller via tactile interaction between the user and the touch screen display.

B7. The probe station of any of paragraphs B1-B6, wherein the chuck includes at least one of:

(i) a chuck thermal module configured to regulate a temperature of the chuck;

(ii) a chuck translation structure configured to operatively translate the support surface relative to the probe assembly; and (iii) a chuck rotation structure configured to operatively rotate the support surface relative to the probe assembly.

INDUSTRIAL APPLICABILITY

The methods disclosed herein are applicable to the semiconductor manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of controlling the operation of a probe station, wherein the probe station includes a probe assembly that is configured to electrically test the operation of a plurality of devices under test (DUTs) formed on a substrate, the method comprising:

generating a test routine by:
  (i) constructing a substrate map that includes information regarding a position of each DUT of the plurality of DUTs on the substrate;
  (ii) receiving a test subset input from a user, wherein the test subset input is representative of a test subset of the plurality of DUTs, wherein each DUT in the test subset is selected to be subjected to an electrical test;
  (iii) updating the substrate map to incorporate information regarding which DUTs of the plurality of DUTs are in the test subset;
  (iv) receiving a pre-test subset input from the user, wherein the pre-test subset input is representative of a pre-test subset of the test subset, wherein each DUT in the pre-test subset is selected to be subjected to a pre-test routine; and
  (v) updating the substrate map to incorporate information regarding which DUTs of the test subset are in the pre-test subset; and executing the test routine by:
  (i) moving the probe assembly from a given DUT in the test subset of the plurality of DUTs to a subsequent DUT in the test subset of the plurality of DUTs;
  (ii) determining whether the subsequent DUT is in the pre-test subset;
  (iii) subsequent to the determining, selectively performing the pre-test routine on the subsequent DUT, wherein the selectively performing includes performing the pre-test routine responsive to the determining indicating that the subsequent DUT is included in the pre-test subset and skipping the pre-test routine responsive to the determining indicating that the subsequent DUT is not included in the pre-test subset;
  (iv) subsequent to the selectively performing, electrically testing the subsequent DUT; and
  (v) subsequent to the electrically testing, repeating the moving, the determining, the selectively performing, and the electrically testing to perform the pre-test routine on each remaining DUT in the pre-test subset and also to electrically test each remaining DUT in the test subset.

2. The method of claim 1, wherein the pre-test routine includes at least one of:
  (i) a thermal soaking; and
  (ii) a probe-to-pad alignment.

3. The method of claim 1, wherein the generating the test routine further includes, prior to the receiving the test subset input, prompting the user to select the test subset.

4. The method of claim 3, wherein the prompting the user to select the test subset includes producing a graphical representation of the substrate map on a display.

5. The method of claim 1, wherein the method further includes, subsequent to the receiving the test subset input, indicating, to the user, which DUTs of the plurality of DUTs are in the test subset.

6. The method of claim 5, wherein the indicating includes producing a graphical representation of the substrate map on the display.

7. The method of claim 1, wherein the generating the test routine further includes, prior to the receiving the pre-test subset, prompting the user to select the pre-test subset.

8. The method of claim 7, wherein the prompting the user to select the pre-test subset includes producing a graphical representation of the substrate map and of the test subset on the display.

9. The method of claim 1, wherein the method further includes, subsequent to the receiving the pre-test subset input, indicating, to the user, which DUTs of the plurality of DUTs are in the pre-test subset.

10. The method of claim 9, wherein the indicating includes producing a graphical representation of the substrate map and of the pre-test subset on the display.

11. The method of claim 1, wherein the pre-test subset is a first pre-test subset; wherein the pre-test routine is a first pre-test routine; wherein the determining is a first determining whether the subsequent DUT is in the first pre-test subset; wherein the selectively performing the pre-test routine is a first selectively performing the first pre-test routine; wherein the generating the test routine further includes:
(i) receiving a second pre-test subset input from the user, wherein the second pre-test subset input is representative of a second pre-test subset of the test subset, wherein each DUT in the second pre-test subset is selected to be subjected to a second pre-test routine; and
(ii) updating the substrate map to incorporate information regarding which DUTs of the test subset are in the second pre-test subset;
wherein the executing the test routine further includes, prior to the electrically testing the subsequent DUT:
(i) second determining whether the subsequent DUT is in the second pre-test subset;
(ii) subsequent to the second determining, second selectively performing the second pre-test routine on the subsequent DUT, wherein the second selectively performing includes performing the second pre-test routine responsive to the second determining indicating that the subsequent DUT is included in the second pre-test subset and skipping the second pre-test routine responsive to the second determining indicating that the subsequent DUT is not included in the second pre-test subset;
and wherein the executing the test routine further includes, subsequent to the electrically testing, repeating the second determining and the second selectively performing to perform the second pre-test routine on each DUT in the second pre-test subset.

12. The method of claim 11, wherein the generating the test routine further includes, prior to the receiving the second pre-test subset, prompting the user to select the second pre-test subset.

13. The method of claim 12, wherein the prompting the user to select the second pre-test subset includes producing a graphical representation of the substrate map and of the test subset on the display.

14. The method of claim 11, wherein the method further includes, subsequent to the receiving the second pre-test subset input, indicating, to the user, which DUTs of the plurality of DUTs are in the second pre-test subset.

15. The method of claim 14, wherein the indicting includes producing a graphical representation of the substrate map and of the second pre-test subset on the display.

16. The method of claim 11, wherein the second pre-test subset is a subset of the first pre-test subset.

17. The method of claim 11, wherein the performing the first pre-test routine and the performing the second pre-test routine are performed sequentially.

18. The method of claim 11, wherein the performing the first pre-test routine and the performing the second pre-test routine are performed at least partially concurrently.

19. The method of claim 1, wherein the executing the test routine is configured to be performed without human supervision.

20. The probe station configured to test the operation of each of the plurality of DUTs formed on the substrate, the probe station comprising:
a chuck that defines a support surface that is configured to support the substrate;
the probe assembly, wherein the probe assembly includes a plurality of probes with a plurality of corresponding probe tips configured to contact a plurality of corresponding contact pads of the plurality of DUTs; and
a controller configured to execute the method of claim 1.

* * * * *

UNITED STATES PATENT AND TRADEMARK OFFICE
CERTIFICATE OF CORRECTION

PATENT NO. : 11,016,121 B2  
APPLICATION NO. : 16/421173  
DATED : May 25, 2021  
INVENTOR(S) : Sia Choon Beng, David Randle Hess and Chunyi Yin Leong Page 1 of 1

It is certified that error appears in the above-identified patent and that said Letters Patent is hereby corrected as shown below:

In the Claims

Claim 15, Column 16, Line 25, please delete "indicting" and insert --indicating-- therefor.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*